US009106993B2

(12) United States Patent
Kondo et al.

(10) Patent No.: US 9,106,993 B2
(45) Date of Patent: Aug. 11, 2015

(54) SOUND PROCESSING APPARATUS

(71) Applicant: Yamaha Corporation, Hamamatsu-shi, Shizuoka-ken (JP)

(72) Inventors: Kazunobu Kondo, Hamamatsu (JP); Yu Takahashi, Hamamatsu (JP); Yasuyuki Umeyama, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 298 days.

(21) Appl. No.: 13/791,015

(22) Filed: Mar. 8, 2013

(65) Prior Publication Data

US 2013/0243211 A1 Sep. 19, 2013

(30) Foreign Application Priority Data

Mar. 14, 2012 (JP) ................................ 2012-057256

(51) Int. Cl.
*H03G 3/00* (2006.01)
*H04R 3/04* (2006.01)
*H04S 7/00* (2006.01)

(52) U.S. Cl.
CPC *H04R 3/04* (2013.01); *H04S 7/302* (2013.01); *H04S 7/305* (2013.01); *H04S 7/40* (2013.01); *H04S 2420/07* (2013.01)

(58) Field of Classification Search
CPC ........ H04S 7/305; G10K 15/08; H04R 29/00; H04R 3/005; H04R 29/004; H04R 29/001; G10H 1/0091; G06F 3/165; G06F 17/3074
USPC ............................ 381/56, 58, 61, 63; 700/94
See application file for complete search history.

(56) References Cited

U.S. PATENT DOCUMENTS 8,467,538 B2 6/2013 Nakatani et al.
2007/0189551 A1 8/2007 Kimijima
(Continued)

FOREIGN PATENT DOCUMENTS

CN 10208466 6/2011
EP 2 355 557 A2 8/2011
(Continued)

OTHER PUBLICATIONS

Vinyes, M. et al. (May 2006). "Demixing Commercial Music Productions via Human-Assisted Time-Frequency Masking," *Audio Engineering Society*, presented at the 120th Convention, May 20-23, 2006, Paris, France, 9 pages.
(Continued)

*Primary Examiner* — Rasha Al Aubaidi
(74) *Attorney, Agent, or Firm* — Morrison & Foerster LLP

(57) ABSTRACT

In a sound processing apparatus, a likelihood calculation unit calculates an in-region coefficient and an out-of-region coefficient indicating likelihood of generation of each frequency component of a sound signal inside and outside a target localization range, respectively, according to localization of each frequency component. A reverberation analysis unit calculates a reverberation index value according to the ratio of a reverberation component for each frequency component. A coefficient setting unit generates a process coefficient for suppressing or emphasizing a reverberation component generated inside or outside the target localization range, for each frequency component of the sound signal, on the basis of the in-region coefficient, the out-of-region coefficient and the reverberation index value. A signal processing unit applies the process coefficient of each frequency component to each frequency component of the sound signal.

10 Claims, 4 Drawing Sheets

(56) References Cited

U.S. PATENT DOCUMENTS

| | | | |
|---|---|---|---|
| 2007/0274528 | A1 | 11/2007 | Nakamoto et al. |
| 2011/0132175 | A1 | 6/2011 | Sato et al. |

FOREIGN PATENT DOCUMENTS

| | | | |
|---|---|---|---|
| JP | 2011-158674 | A | 8/2011 |
| WO | WO-2011/054876 | A1 | 5/2011 |

OTHER PUBLICATIONS

European Search Report mailed Nov. 21, 2013, for EP Application No. EP 13001225.5, five pages.

Notification of the First Office Action dated Feb. 2, 2015, for CN Application No. 201310080322.7, with English translation, seven pages.

Chinese Search Report dated Feb. 2, 2015, for CN Application No. 201310080322.7, with English translation, four pages.

SOUND PROCESSING APPARATUS

BACKGROUND OF THE INVENTION

1. Technical Field of the Invention

The present invention relates to technology for processing a sound signal.

2. Description of the Related Art

Japanese Patent Application Publication No. 2011-158674 discloses technology using a display device for displaying intensity distribution of a sound signal on a frequency-localization plane on which a frequency domain and a localization domain are set. According to Japanese Patent Application Publication No. 2011-158674, a sound component of a sound signal, which stays in a particular region (referred to as 'target region' hereinafter) set on the frequency-localization plane by a user, is extracted. Accordingly, it is possible to extract a sound component (e.g. sound of a specific musical instrument) included in a specific band, generated from a sound source located in a specific direction.

However, a sound signal may include a reverberation component. A localization estimated through analysis of a sound signal for a sound component (referred to as 'initial sound component' hereinafter) immediately after the sound signal is generated from a sound source (before the sound signal reverberates) may be different from a localization with respect to a reverberation component obtained when the initial sound component is reflected and diffused in an acoustic space. For example, even when the initial sound component is localized outside a target region, the reverberation component may be localized within the target region.

Accordingly, the technology of Japanese Patent Application Publication No. 2011-158674, which simply extracts a sound component corresponding to the target region, may inappropriately extract a reverberation component corresponding to the target region, which is derived from a sound source located outside the target region, along with the sound component generated from a sound source within the target region. Similarly, when the initial sound component is localized within the target region, its reverberation component may be localized outside the target region. Accordingly, when the sound component corresponding to the target region is suppressed according to the technology of Japanese Patent Application Publication No. 2011-158674, the reverberation component outside the target region may be inappropriately maintained without being suppressed together with a sound component from the sound source located outside the target region, and thus a listener perceives the reverberation component as being emphasized. As described above, the technology of Japanese Patent Application Publication No. 2011-158674 has a problem that a sound component of a sound source located in a specific direction is difficult to separate (emphasize or suppress) with accuracy.

SUMMARY OF THE INVENTION

An object of the present invention is to separate a sound component of a sound source located in a specific direction with high accuracy.

Means employed by the present invention to solve the above-described problem will be described. To facilitate understanding of the present invention, correspondence between claimed elements of the present invention and disclosed elements of embodiments which will be described later is indicated by parentheses in the following description. However, the present invention is not limited to the embodiments.

A sound processing apparatus of the present invention comprises a localization analysis unit (e.g. localization analyzer 34) configured to calculate a localization (e.g. localization $\theta(k, m)$) of each frequency component of a sound signal, a likelihood calculation unit (e.g. likelihood calculator 42) configured to calculate an in-region coefficient (e.g. in-region coefficient $L_{in}(k,m)$) and an out-of-region coefficient (e.g. out-of-region coefficient $L_{out}(k,m)$) on the basis of the localization of each frequency component, the in-region coefficient indicating likelihood of generation of each frequency component of the sound signal from a sound source within a given target localization range (e.g. target localization range SP), the out-of-region coefficient (e.g. out-of-region coefficient $L_{out}(k,m)$) indicating likelihood of generation of each frequency component from a sound source located outside the target localization range, a reverberation analysis unit (e.g. reverberation analyzer 44) configured to calculate a reverberation index value (e.g. a reverberation index value $R(k,m)$) on the basis of the ratio of a reverberation component for each frequency component of the sound signal, a coefficient setting unit (e.g. coefficient setting unit 46) configured to generate a process coefficient (e.g. process coefficient $G_{in}(k,m)$ and process coefficient $G_{out}(k,m)$) for suppressing or emphasizing a reverberation component derived from the sound source within the target localization range or a reverberation component derived from the sound source located outside the target localization range for each frequency component on the basis of the in-region coefficient, the out-of-region coefficient and the reverberation index value, and a signal processing unit (e.g. a signal processor 52) configured to apply the process coefficient of each frequency component to each frequency component of the sound signal.

In this configuration, since the in-region coefficient and the out-of-region coefficient in addition to the reverberation index value are reflected in the process coefficient, it is possible to suppress or emphasize the reverberation component derived from the sound source within the target localization range and the reverberation component derived from the sound source located outside the target localization range with high accuracy. 'Emphasizing' a reverberation component includes not only a case in which the reverberation component is amplified but also a case in which a component of the sound signal other than the reverberation component is suppressed while the reverberation component is maintained such that the reverberation component is perceived as being relatively emphasized.

According to a preferred aspect of the present invention, the sound processing apparatus further comprises a range setting unit (e.g. range setting unit 38) configured to set the target localization range (e.g. target localization range SP) on a localization domain.

Specifically, the range setting unit sets a target region (e.g. a target region S) that is defined on a frequency-localization plane and that has a target frequency range in a frequency domain of the frequency-localization plane and the target localization range in the localization domain of the frequency-localization plane, and the likelihood calculation unit includes a region determination unit (e.g. a region determination unit 72) configured to calculate in-region localization information (e.g. in-region localization information $\Gamma_{in}(k, m)$) indicating whether each frequency component of the sound signal is located within the target region and out-of-region localization information (e.g. out-of-region localization information $\Gamma_{out}(k,m)$) indicating whether each frequency component is located outside the target region, for each unit period on the basis of the localization of each frequency component, and a calculation processing unit (e.g.

a calculation processor 74A or calculation processor 74B) configured to calculate the in-region coefficient based on a moving average of the in-region localization information over unit periods and to calculate the out-of-region coefficient based on a moving average of the out-of-region localization information over unit periods.

In this configuration, since the in-region coefficient is calculated on the basis of the moving average of the in-region localization information and the out-of-region coefficient is calculated on the basis of the moving average of the out-of-region localization information, calculation processing is simplified as compared to a configuration in which the in-region coefficient and the out-of-region coefficient are applied to a predetermined probability distribution to calculate the in-region coefficient and the out-of-region coefficient.

According to a preferred aspect of the present invention, the signal processing unit applies the process coefficient of each frequency component and one of the in-region localization information and the out-of-region localization information of each frequency component to each frequency component of the sound signal.

In this configuration, the in-region localization information or the out-of-region localization information and the process coefficient are applied to signal processing by the signal processing unit. Accordingly, it is possible to emphasize or suppress a reverberation component according to a combination of the inside and outside of a target region of each frequency component and the inside and outside of the sound source from which each frequency component is derived. For example, it is possible to emphasize or suppress a reverberation component outside the target region, which is derived from the sound source located within the target region and to emphasize or suppress a reverberation component in the target region, which is derived from the sound source located outside the target region. Furthermore, it is possible to emphasize or suppress a reverberation component in the target region, which is derived from the sound source located within the target region and to emphasize or suppress a reverberation component outside the target region, which is derived from the sound source located outside the target region.

According to a preferred aspect of the present invention, the calculation processing unit includes a first calculation unit (e.g. first calculator 741) configured to calculate a short term in-region coefficient (e.g. short term in-region coefficient $L_{in}(k,m)$_short) by smoothing a time series of the in-region localization information and to calculate a short term out-of-region coefficient (e.g. short term out-of-region coefficient $L_{out}(k,m)$_short) by smoothing a time series of the out-of-region localization information, a second calculation unit (e.g. second calculator 742) configured to calculate a long term in-region coefficient (e.g. long term in-region coefficient $L_{in}(k,m)$_long) by smoothing the time series of the in-region localization information and to calculate a long term out-of-region coefficient (e.g. long term out-of-region coefficient $L_{out}(k,m)$_long) by smoothing the time series of the out-of-region localization information, the second calculation unit performing the smoothing using a time constant greater than a time constant of the smoothing performed by the first calculation unit, and a third calculation unit (e.g. third calculator 743) configured to calculate the in-region coefficient according to the short term in-region coefficient relative to the long term out-of-region coefficient and to calculate the out-of-region coefficient according to the short term out-of-region coefficient relative to the long term in-region coefficient.

In this configuration, it is possible to generate the process coefficient in which both likelihood of generation of each frequency component from the sound source located inside or outside the target localization range and likelihood of each frequency component being a reverberation component are reflected.

According to a preferred aspect of the present invention, the reverberation analysis unit includes a first analysis unit (e.g. first analyzer 82A or first analyzer 82B) configured to calculate a first index value (e.g. first index value $Q_1(k,m)$) following a time variation of the sound signal and a second index value (e.g. second index value $Q_2(k,m)$ following the time variation of the sound signal with following capability lower than that of the first index value, and a second analysis unit (e.g. second analyzer 84) configured to calculate the reverberation index value based on a difference between the first index value and the second index value.

In this aspect, since the reverberation index value is calculated on the basis of the difference between the first index value and the second index value that follow the time variation of the sound signal, it is possible to analyze the reverberation component and the initial sound component of the sound signal through simple processing, compared to estimating a reverberation component using a probability model having a predictive filter factor.

However, a known technology is employed for calculation (analysis of a reverberation component) of the reverberation index value in the present invention. According to a preferred aspect of the present invention, the first analysis unit includes a first smoothing unit (e.g. first smoothing unit 821) for calculating the first index value by smoothing time series of the intensity of the sound signal and a second smoothing unit (e.g. second smoothing unit 822) for calculating the second index value by smoothing the time series of the intensity of the sound signal using a time constant greater than a time constant of smoothing according to the first smoothing unit. According to a different aspect, the index value calculation unit generates the first index value and the second index value by smoothing the time series of the intensity of the sound signal such that a time variation of the second index value delays a time variation of the first index value.

The sound processing apparatus according to the above-described aspects is implemented by not only hardware (electronic circuit) such as a DSP (Digital Signal Processor) dedicated for sound signal processing but also cooperation of a general-use processing unit such as a CPU (Central Processing Unit) and a program. The program according to the present invention is execute by a computer to perform processing of a sound signal, comprising: calculating a localization of each frequency component of a sound signal; calculating an in-region coefficient and an out-of-region coefficient on the basis of the localization of each frequency component of the sound signal, the in-region coefficient indicating likelihood of generation of each frequency component from a sound source within a given target localization range, the out-of-region coefficient indicating likelihood of generation of each frequency component from a sound source located outside the target localization range; calculating a reverberation index value on the basis of the ratio of a reverberation component for each frequency component of the sound signal; generating a process coefficient for suppressing or emphasizing a reverberation component generated from a sound source within the target localization range or a reverberation component generated from a sound source located outside the target localization range, for each frequency component of the sound signal, on the basis of the in-region coefficient, the out-of-region coefficient and the reverberation index value; and applying the process coefficient of each frequency component to each frequency component of the sound signal.

According to the program, the same operation and effect as those of the sound processing apparatus according to the present invention can be implemented. The program of the present invention can be provided in such a manner that the program is stored in a computer readable non-transitory recording medium and installed in a computer. Alternatively, the program of the present invention can be distributed through a communication network and installed in a computer.

DETAILED DESCRIPTION OF THE INVENTION

First Embodiment

Figure 1:
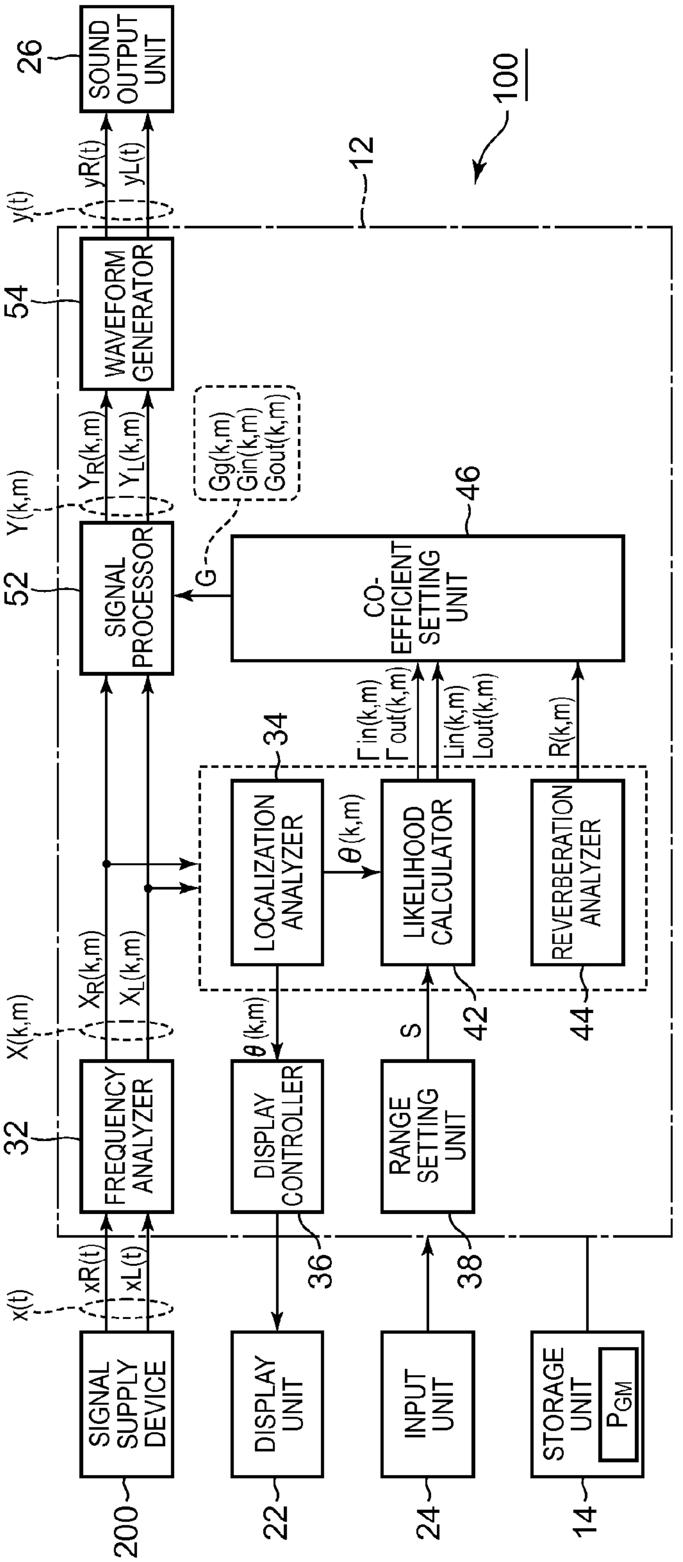
FIG. 1 is a block diagram of a sound processing apparatus according to a first embodiment of the present invention.

FIG. 1 is a block diagram of a sound processing apparatus 100 according to a first embodiment of the present invention. As shown in FIG. 1, a signal supply device 200 is connected to the sound processing apparatus 100. The signal supply device 200 supplies a sound signal x(t) indicating the waveform of mixed sound of a plurality of sounds (singing and musical instrument sound) generated from sound sources in different locations to the sound processing apparatus 100. The sound signal x(t) is a stereo signal composed of a left-channel sound signal xL(t) and a right-channel sound signal xR(t), which are obtained or processed such that sound images respectively corresponding to the sound sources are located at different positions (e.g. an intensity difference and phase difference between left and right channels are adjusted). It is possible to employ a sound acquisition device that generates the sound signal x(t) by acquiring surrounding sound, a reproduction device that obtains the sound signal x(t) from a variable or built-in recording medium, and a communication device that receives the sound signal x(t) from a communication network as the signal supply device 200. The sound processing apparatus 100 and the signal supply device 200 may be integrated.

The sound processing apparatus 100 generates a sound signal y(t) by emphasizing or suppressing a specific sound component in the sound signal x(t). The sound signal y(t) is a stereo signal composed of a left-channel sound signal yL(t) and a right-channel sound signal yR(t). As shown in FIG. 1, the sound processing apparatus 100 according to the first embodiment of the present invention is implemented as a computer system including a processing unit 12, a storage unit 14, a display unit 22, an input unit 24 and a sound output unit 26.

The display unit 22 (e.g. a liquid crystal display panel) displays images under the control of the processing unit 12. The input unit 24 receives instructions from a user of the sound processing apparatus 100 and includes a plurality of manipulators which can be manipulated by the user, for example. A touch panel integrated with the display unit 22 may be used as the input unit 24. The sound output unit 26 (e.g. a speaker or a headphone) reproduces sound corresponding to the sound signal y(t).

The storage unit 14 stores a program PGM executed by the processing unit 12 and data used by the processing unit 12. A known recording medium such as a semiconductor recording medium and a magnetic recording medium or a combination of various types of recording media is employed as the storage unit 14. A configuration in which the sound signal x(t) is stored in the storage unit 14 can be employed (in this case, the signal supply device 200 is omitted).

The processing unit 12 implements a plurality of functions (a frequency analyzer 32, a localization analyzer 34, a display controller 36, a range setting unit 38, a likelihood calculator 42, a reverberation analyzer 44, a coefficient setting unit 46, a signal processor 52, and a waveform generator 54) for generating the sound signal y(t) from the sound signal x(t) by executing the program PGM stored in the storage unit 14. It is possible to employ a configuration in which the functions of the processing unit 12 are distributed to a plurality of units and a configuration in which some functions of the processing unit 12 are implemented by a dedicated circuit (for example, DSP).

The frequency analyzer 32 calculates a frequency component X(k,m) (a frequency component $X_L$(k,m) of the sound signal xL(t) and a frequency component $X_R$(k,m) of the sound signal xR(t)) of the sound signal x(t) for each of K frequencies f1 to fK set to the frequency domain in each unit period (frame) in the time domain. Here, k denotes a frequency (frequency band) fk from among the K frequencies f1 to fK and m denotes an arbitrary time (unit period) in the time domain. A known frequency analysis method such as short-time Fourier transform, for example, is employed to calculate each frequency component X(k,m). It is possible to use a filter bank composed of a plurality of band pass filters having different pass bands as the frequency analyzer 32.

The localization analyzer 34 calculates a direction θ(k,m) (referred to as 'localization' hereinafter) in which a sound image corresponding to each frequency component X(k,m) of the sound signal x(t) is positioned for each unit period. It is possible to employ a known technique to calculate the localization θ(k,m). For example, the following equation (1) using the amplitude $|X_L(k,m)|$ of the left-channel frequency component $X_L$(k,m) and the amplitude $|X_R(k,m)|$ of the right-channel frequency component $X_R$(k,m) is preferably used to calculate the localization θ(k,m). When the localization θ(k,m) calculated according to Equation (1) is 0, the localization represents the front of a listener. The left side of the front is represented by a negative number and the right side of the front is represented by a positive number. Equation (1) is disclosed in "Demixing Commercial Music Productions via Human-Assisted Time-Frequency Masking", by M. Vinyes, J. Bonada, A. Loscos, Audio Engineering Society 120$^{th}$ Convention, France, 2006.

$$\theta(k, m) = 2\arctan\left(\frac{|X_L(k, m)|}{|X_R(k, m)|}\right)\cdot\frac{2}{\pi} - 1 \tag{1}$$

Figure 2:
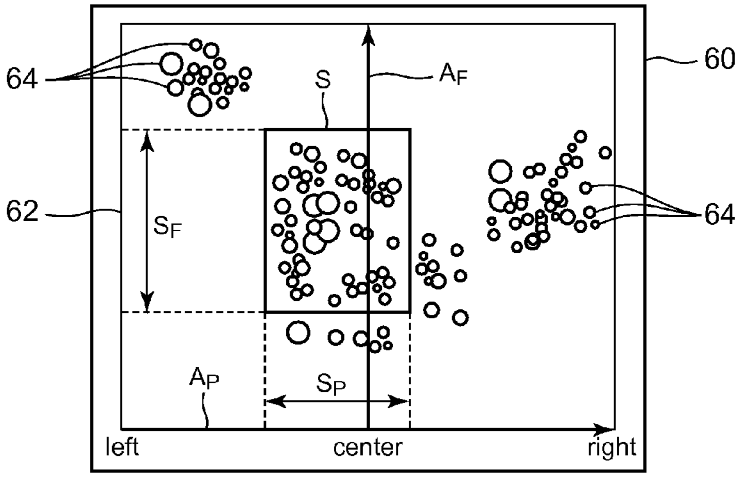
FIG. 2 shows a sound image distribution image.

The display controller 36 shown in FIG. 1 controls the display unit 22 to display a sound image distribution diagram 60 of FIG. 2, which shows an analysis result of the localization analyzer 34. As shown in FIG. 2, the sound image distribution diagram 60 shows distribution of frequency components X(k,m) in a frequency-localization plane 62 to which a frequency domain AF and a localization domain AP are set. A plurality of sound image figures 64 representing the frequency components X(k,m) of the sound signal x(t) in a specific unit period (e.g. a unit period designated by the user) are arranged in the frequency-localization plane 62. Each sound image figure 64 according to the first embodiment is a circular image whose display shape (display size in the example of FIG. 2) is set according to the intensity of each frequency component X(k,m). The sound image figure 64 corresponding to each frequency component X(k,m) is located at coordinates corresponding to the frequency fk of the frequency component X(k,m) on the frequency domain AF and the localization θ(k,m) on the localization domain AP, which is calculated by the localization analyzer 34 for the frequency component X(k,m). Accordingly, the user can recognize the distribution of the frequency components X(k,m) of the sound signal x(t) on the frequency-localization plane 62 by viewing distribution of the sound image figures 64.

The user can designate a desired region (referred to as 'target region' hereinafter) S in the frequency-localization plane 62 by appropriately manipulating the input unit 24. The range setting unit 38 shown in FIG. 1 sets the target region S according to a user instruction, applied to the input unit 24. The target region S according to the first embodiment is a rectangular region defined by a target frequency range SF on the frequency domain AF and a target localization range SP on the localization domain AP. The range setting unit 38 variably sets positions and scopes (that is, the position and range of the target region S) of the target frequency range SF and the target localization range SP according to an instruction from the user. The shape of the target region S is not limited to a specific one. It is possible to set a plurality of target regions S in the frequency-localization plane 62.

A localization θ(k,m) estimated by the localization analyzer 34 for an initial sound component of sound generated from a sound source may be different from a localization θ(k,m) estimated by the localization analyzer 34 for a reverberation component of the sound. Accordingly, while a frequency component X(k,m) whose localization θ(k,m) is within the target localization range SP basically corresponds to a sound component (initial sound component or reverberation component) generated from a sound source positioned in the target localization range SP, there is a possibility that the frequency component X(k,m) is a sound component generated from a sound source outside the target localization range SP. Similarly, while a frequency component X(k,m) whose localization θ(k,m) is outside the target localization range SP basically corresponds to a sound component generated from a sound source outside the target localization range SP, there is a possibility that the frequency component X(k,m) is a sound component generated from a sound source located within the target localization range SP.

In view of the above-described tendency, the likelihood calculator 42 shown in FIG. 1 calculates an index value (referred to as 'in-region coefficient' hereinafter), $L_{in}$(k,m), of likelihood that each frequency component X(k,m) is a sound component generated from a sound source within the target localization range SP and an index value (referred to as 'out-of-region coefficient' hereinafter), $L_{out}$(k,m), of likelihood that each frequency component X(k,m) is a sound component generated from a sound source located outside the target localization range SP for each frequency component X(k,m) (each frequency fk) in each unit period.

Figure 3:
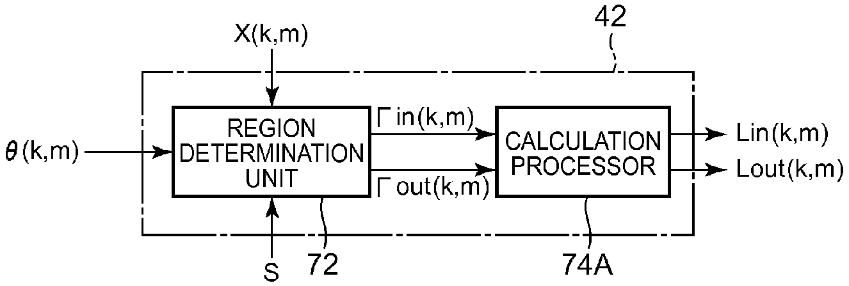
FIG. 3 is a block diagram of a likelihood calculator.

FIG. 3 is a block diagram of the likelihood calculator 42 according to the first embodiment of the present invention. As shown in FIG. 3, the likelihood calculator 42 includes a region determination unit 72 and a calculation processor 74A. The region determination unit 72 calculates in-region localization information $\Gamma_{in}$(k,m) and out-of-region localization information $\Gamma_{out}$(k,m) for each frequency fk in each unit period. The in-region localization information $\Gamma_{in}$(k,m) is information (a flag) that indicates whether the corresponding frequency component X(k,m) is located within the target region S on the frequency-localization plane 62. Specifically, the in-region localization information $\Gamma_{in}$(k,m) of each frequency component X(k,m) is set to 1 when each frequency component X(k,m) is within the target region S (when the frequency fk of the frequency component X(k,m) is positioned within the target frequency range SF and the localization θ(k,m) of the frequency component X(k,m) corresponds to the inside of the target localization range SP) and set to 0 when each frequency component X(k,m) is located outside the target region S.

The out-of-region localization information $\Gamma_{out}$(k,m) is information (a flag) that indicates whether the corresponding frequency component X(k,m) is located outside the target region S on the frequency-localization plane 62. Specifically, the out-of-region localization information $\Gamma_{out}$(k,m) of each frequency component X(k,m) is set to 1 when each frequency component X(k,m) is located outside the target region S (when the frequency fk of the frequency component X(k,m) is positioned outside the target frequency range SF and the localization θ(k,m) of the frequency component X(k,m) corresponds to the outside of the target localization range SP) and set to 0 when each frequency component X(k,m) is within the target region S. As known from the above description, the sum of in-region localization information $\Gamma_{in}$(k,m) and out-of-region localization information $\Gamma_{out}$(k,m) corresponding to a single frequency component X(k,m) becomes 1 ($\Gamma_{in}$(k,m)+$\Gamma_{out}$(k,m)=1). A frequency component X(k,m) having in-region localization information $\Gamma_{in}$(k,m) of 1 is not limited to a sound component (an initial sound component of sound generated from a sound source or a reverberation component of the initial sound component) generated from a sound source within the target region S, and a frequency component X(k,m) having out-of-region localization information $\Gamma_{out}$(k,m) of 1 is not limited to a sound component generated from a sound source located outside the target region S.

The calculation processor 74A shown in FIG. 3 calculates in-region coefficient $L_{in}$(k,m) based on the in-region localization information $\Gamma_{in}$(k,m) and out-of-region coefficient $L_{out}$(k,m) based on the out-of-region localization information $\Gamma_{out}$(k,m) for each frequency component X(k,m) in each unit period. The calculation processor 74A according to the first embodiment calculates a moving average of the in-region localization information $\Gamma_{in}$(k,m) and out-of-region localization information $\Gamma_{out}$(k,m). Specifically, the calculation processor 74A calculates an indexed moving average (index average) of the in-region localization information $\Gamma_{in}$(k,m) as the in-region coefficient $L_{in}$(k,m), as represented by Equation (2A), and calculates an indexed moving average of the out-of-region localization information $\Gamma_{out}$(k,m) as the out-of-region coefficient $L_{out}$(k,m), as represented by Equation (2B).

$$L_{in}(k,m)=\lambda\Gamma_{in}(k,m)+(1-\lambda)L_{in}(k,m-1) \quad (2A)$$

$$L_{out}(k,m)=\lambda\Gamma_{out}(k,m)+(1-\lambda)L_{out}(k,m-1) \quad (2B)$$

In Equations (2A) and (2B), λ denotes a smoothing factor (forgetting factor) and is set to a positive number less than 1.

As can be seen from Equation (2A), the in-region coefficient $L_{in}$(k,m) increases as the frequency of locations of frequency components X(k,m) within the target region S in a previous unit period increases (namely, likelihood that the frequency components X(k,m) is derived from a sound source within the target region S increases). In addition, as can be seen from Equation (2B), the out-of-region coefficient $L_{out}$(k,m) increases as the frequency of locations of frequency components X(k,m) outside the target region S in a previous unit period increases (namely, likelihood that the frequency components X(k,m) is derived from a sound source located outside the target region S increases).

The reverberation analyzer 44 shown in FIG. 1 analyzes a reverberation component of the sound signal x(t). Specifically, the reverberation analyzer 44 calculates a reverberation index value R(k,m) depending on the ratio of the reverberation component (or the ratio of an initial sound component) to the sound signal x(t) for each of the K frequency components X(k,m) in each unit period. The reverberation index value R(k,m) tends to decrease as the intensity or magnitude of the reverberation component increases in the frequency components X(k,m) (the reverberation component is superior to the initial sound component). That is, the reverberation index value R(k,m) according to the first embodiment can also be referred to as superiority or dominancy of the initial sound component for the frequency components X(k,m).

Figure 4:
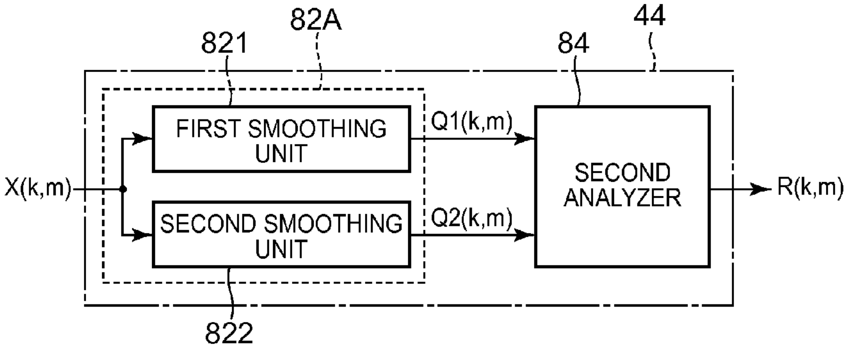
FIG. 4 is a block diagram of a reverberation analyzer.

FIG. 4 is a block diagram of the reverberation analyzer 44. As shown in FIG. 4, the reverberation analyzer 44 according to the first embodiment includes a first analyzer 82A and a second analyzer 84. The first analyzer 82A calculates a first index value $Q_1$(k,m) and a second index value $Q_2$(k,m) corresponding to each frequency component X(k,m) in each unit period. As shown in FIG. 4, the first analyzer 82A according to the first embodiment includes a first smoothing unit 821 and a second smoothing unit 822. The first smoothing unit 821 calculates the first index value $Q_1$(k,m) of each frequency fk in each unit period by smoothing time series of power $|X(k,m)|^2$ of each frequency component X(k,m). Similarly, the second smoothing unit 822 calculates the second index value $Q_2$(k,m) of each frequency fk by smoothing time series of power $|X(k,m)|^2$ of each frequency component X(k,m) in each unit period.

The first index value $Q_1$(k,m) is the indexed moving average of power $|X(k,m)|^2$ of to which a smoothing factor $\alpha_1$ is applied, as defined by Equation (3A). The second index value $Q_2$(k,m) is the indexed moving average of power $|X(k,m)|^2$ of to which a smoothing factor $\alpha_2$ is applied, as defined by Equation (3B). The smoothing factor $\alpha_1$ indicates a weight of current power $|X(k,m)|^2$ of for a previous first index value $Q_1$(k,m−1) and the smoothing factor $\alpha_2$ indicates a weight of current power $|X(k,m)|^2$ of for a previous second index value $Q_2$(k,m−1). As will be understood from the following description, the first smoothing unit 821 and the second smoothing unit 822 correspond to IIR (Infinite Impulse Response) type low pass filters.

$$Q_1(k,m)=\alpha_1\cdot|X(k,m)|^2+(1-\alpha_1)\cdot Q_1(k,m-1) \quad (3A)$$

$$Q_2(k,m)=\alpha_2\cdot|X(k,m)|^2+(1-\alpha_2)\cdot Q_2(k,m-1) \quad (3B)$$

The smoothing factor $\alpha_1$ is set to a value greater than the smoothing factor $\alpha_2$ ($\alpha_1>\alpha_2$). Accordingly, a time constant τ2 of smoothing according to the second smoothing unit 822 is greater than a time constant τ1 of smoothing according to the first smoothing unit 821 (τ2>τ1). On the assumption that the first smoothing unit 821 and the second smoothing unit 822 are implemented as low pass filters, the cutoff frequency of the second smoothing unit 822 is lower than the cutoff frequency of the first smoothing unit 821.

Figure 5A:
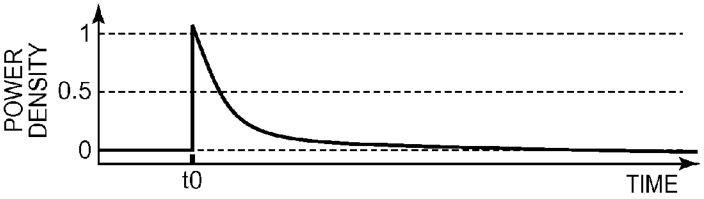
FIGS. 5A-5C illustrate the relationship between a first index value and a second index value.
Figure 5B:
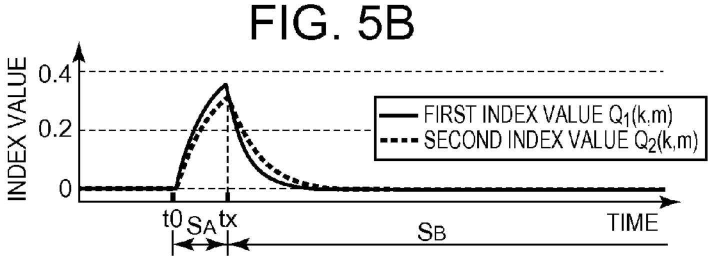

FIG. 5B is a graph showing a time variation of the first index value $Q_1$(k,m) and the second index value $Q_2$(k,m) for a frequency fk. FIG. 5B shows the first index value $Q_1$(k,m) and the second index value $Q_2$(k,m) when a room impulse response (RIR) whose power $|X(k,m)|^2$ (power density) exponentially decays, as shown in FIG. 5A, is supplied as the sound signal x(t) to the sound processing apparatus 100.

As can be understood from FIG. 5B, the first index value $Q_1$(k,m) and the second index value $Q_2$(k,m) are temporally varied following the power $|X(k,m)|^2$ of the frequency component X(k,m). However, since the time constant τ2 of smoothing performed by the second smoothing unit 822 is greater than the time constant τ1 of smoothing performed by the first smoothing unit 821, the second index value $Q_2$(k,m) follows a time variation of the power $|X(k,m)|^2$ of the frequency component X(k,m) with following capability (variation) lower than the first index value $Q_1$(k,m). Specifically, as shown in FIG. 5B, in a period following RIR initiation point t0, the first index value $Q_1$(k,m) increases at a variation rate higher than that of the second index value $Q_2$(k,m). The first index value $Q_1$(k,m) and the second index value $Q_2$(k,m) reach respective peaks at different points in time and the first index value $Q_1$(k,m) decreases at a variation rate higher than that of the second index value $Q_2$(k,m).

Since the first index value $Q_1$(k,m) and the second index value $Q_2$(k,m) are varied at different variation rates, as described above, levels of the first index value $Q_1$(k,m) and the second index value $Q_2$(k,m) are reversed at a specific time tx on the time domain. That is, the first index value $Q_1$(k,m) is greater than the second index value $Q_2$(k,m) in a period SA from time t0 to time tx, and the second index value $Q_2$(k,m) is greater than the first index value $Q_1$(k,m) in a period SB after time tx. The period SA corresponds to a period in which an initial sound component (direct sound) of the room impulse response is present and the period SB corresponds to a period in which a reverberation component (late reverberation) of the room impulse response is present.

The second analyzer 84 shown in FIG. 4 calculates a reverberation index value R(k,m) corresponding to a difference between the first index value $Q_1$(k,m) and the second index value $Q_2$(k,m) for each frequency component X(k,m) in each unit period. The second analyzer 84 according to the first embodiment calculates the ratio of the first index value $Q_1$(k,m) to the second index value $Q_2$(k,m) as the reverberation index value R(k,m), as represented by Equation (4).

$$R(k,m)=\frac{Q_1(k,m)}{Q_2(k,m)} \quad (4)$$

Figure 5C:
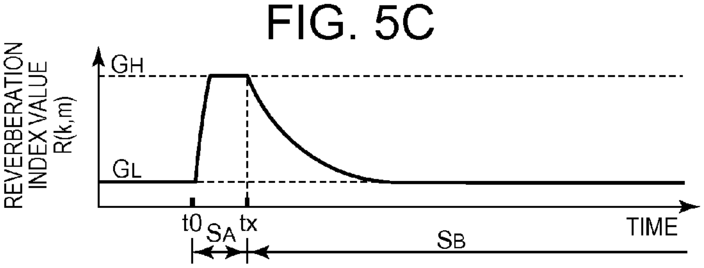

FIG. 5C shows a variation in the reverberation index value R(k,m) when the first index value $Q_1$(k,m) and the second index value $Q_2$(k,m) are varied as shown in FIG. 5B. In FIG. 5C, the range of the reverberation index value R(k,m) is limited to a range between the upper limit $G_H$ and the lower limit $G_L$. As can be seen from FIG. 5C, the reverberation index value R(k,m) observed when the first index value $Q_1$(k,m) exceeds the second index value $Q_2$(k,m) (period SA) is set to a numerical value greater than the reverberation index value R(k,m) observed when the first index value $Q_1$(k,m) is smaller than the second index value $Q_2$(k,m) (period SB). Specifically, the reverberation index value R(k,m) is set to a large value in the period SA in which the initial sound component of the frequency component X(k,m) is superior to or dominant over the reverberation component, and temporally decreases in the period SB in which the reverberation component of the frequency component X(k,m) is relatively superior to or dominant over the initial sound component. Accordingly, it is possible to use the reverberation index value R(k, m) as an index value of the ratio of the reverberation component to the initial sound component for each frequency component X(k,m).

The coefficient setting unit 46 shown in FIG. 1 calculates process coefficients G ($G_g$(k,m), $G_{in}$(k,m) and $G_{out}$(k,m)) for suppressing the reverberation component of the sound signal x(t) in each unit period on the basis of the in-region coefficient $L_{in}$(k,m) and the out-of-region coefficient $L_{out}$(k,m) calculated by the likelihood calculator 42 and the reverberation index value R(k,m) calculated by the reverberation analyzer 44. Each process coefficient G according to the first embodiment is set to a value in the range between the upper limit $G_H$ and the lower limit $G_L$ ($G_L \leq G \leq G_H$). In the first embodiment, a case in which the upper limit $G_H$ is set to 1 is exemplified. The lower limit $G_L$ is set to a numerical value (value in the range of 0 to 1) lower than the upper limit $G_H$. It is also possible to variably set the upper limit $G_H$ and the lower limit $G_L$ according to an instruction input to the input unit 24 by the user.

The process coefficient $G_g$(k,m) is a coefficient (gain) for suppressing the reverberation component of the sound signal x(t). The coefficient setting unit 46 sets the process coefficient $G_g$(k,m) to the upper limit $G_H$ when the reverberation index value R(k,m) exceeds the upper limit $G_H$ (R(k,m)$\geq G_H$) and sets the process coefficient $G_g$(k,m) to the lower limit $G_L$ when the reverberation index value R(k,m) is below the lower limit $G_L$ (R(k,m)$\leq G_L$), as represented by Equation (5). When the reverberation index value R(k,m) is between the upper limit $G_H$ and the lower limit $G_L$ ($G_L <$R(k,m)$< G_H$), the coefficient setting unit 46 sets the process coefficient $G_g$(k,m) to the reverberation index value R(k,m).

$$G_g(k,m) = \begin{cases} G_H & (R(k,m) \geq G_H) \\ R(k,m) & (G_L < R(k,m) < G_H) \\ G_L & (R(k,m) \leq G_L) \end{cases} \tag{5}$$

As can be understood from Equation (5), the process coefficient $G_g$(k,m) decreases as the reverberation component becomes superior to the initial sound component in the frequency component X(k,m) (reverberation index value R(k,m) decreases). Accordingly, when the frequency component X(k,m) is multiplied by the process coefficient $G_g$(k,m), the reverberation component of the sound signal x(t) is suppressed.

The process coefficient $G_{in}$(k,m) is a coefficient (gain) for suppressing a reverberation component of the sound signal x(t), which is generated from a sound source within the target localization range SP. The coefficient setting unit 46 calculates a numerical value (referred to as 'first coefficient' hereinafter) $C_1$(k,m) by multiplying the reverberation index value R(k,m) by the ratio of the out-of-region coefficient $L_{out}$(k,m) to the in-region coefficient Lm(k,m), as represented by Equation (6A), and then performs processing represented by Equation (6B). Specifically, the coefficient setting unit 46 sets the process coefficient $G_{in}$(k,m) to the upper limit $G_H$ when the first coefficient $C_1$(k,m) is above the upper limit $G_H$ ($C_1$(k,m) $\geq G_H$) and sets the process coefficient $G_{in}$(k,m) to the lower limit $G_L$ when the first coefficient $C_1$(k,m) is below the lower limit $G_L$ ($C_1$(k,m)$\leq G_L$). When the first coefficient $C_1$(k,m) is a value in the range between the upper limit $G_H$ and the lower limit $G_L$ ($G_L < C_1$(k,m)$< G_H$), the coefficient setting unit 46 sets the process coefficient $G_{in}$(k,m) to the first coefficient $C_1$(k,m).

$$C_1(k,m) = R(k,m)\frac{L_{out}(k,m)}{L_{in}(k,m)} \tag{6A}$$

$$G_{in}(k,m) = \begin{cases} G_H & (C_1(k,m) \geq G_H) \\ C_1(k,m) & (G_L < C_1(k,m) < G_H) \\ G_L & (C_1(k,m) \leq G_L) \end{cases} \tag{6B}$$

As can be understood from Equations (6A) and (6B), the process coefficient $G_{in}$(k,m) decreases as the reverberation component becomes superior to the initial sound component in the frequency component X(k,m) (the reverberation index value R(k,m) decreases), and the process coefficient $G_{in}$(k,m) (first coefficient $C_1$(k,m)) decreases as likelihood of generation of the frequency component X(k,m) from the sound source within the target localization range SP increases (in-region coefficient Lm(k,m) becomes higher than out-of-region coefficient $L_{out}$(km)). That is, the process coefficient $G_{in}$(k,m) (first coefficient $C_1$(k,m)) decreases as the possibility that the frequency component X(k,m) is a reverberation component generated from the sound source within the target localization range SP increases. Accordingly, when the frequency component X(k,m) is multiplied by the process coefficient $G_{in}$(k,m), the reverberation component of the sound signal x(t), which is generated from the sound source within the target localization range SP, is suppressed.

The process coefficient $G_{out}$(k,m) is a coefficient (gain) for suppressing a reverberation component of the sound signal x(t), which is generated from a sound source located outside the target localization range SP. The coefficient setting unit 46 calculates a numerical value (referred to as 'second coefficient' hereinafter) $C_2$(k,m) by multiplying the reverberation index value R(k,m) by the ratio of the in-region coefficient $L_{in}$(k,m) to the out-of-region coefficient $L_{out}$(k,m), as represented by Equation (7A), and then performs processing represented by Equation (7B). Specifically, the coefficient setting unit 46 sets the process coefficient $G_{out}$(k,m) to the upper limit $G_H$ when the second coefficient $C_2$(k,m) is above the upper limit $G_H$ ($C_2$(k,m)$\geq G_H$) and sets the process coefficient $G_{out}$(k,m) to the lower limit $G_L$ when the second coefficient $C_2$(k,m) is below the lower limit $G_L$ ($C_2$(k,m)$\leq G_L$). When the second coefficient $C_2$(k,m) is a value in the range between the upper limit $G_H$ and the lower limit $G_L$ ($G_L < C_2$(k,m)$< G_H$), the coefficient setting unit 46 sets the process coefficient $G_{out}$(k, m) to the second coefficient $C_2$(k,m).

$$C_2(k,m) = R(k,m)\frac{L_{in}(k,m)}{L_{out}(k,m)} \tag{7A}$$

$$G_{out}(k,m) = \begin{cases} G_H & (C_2(k,m) \geq G_H) \\ C_2(k,m) & (G_L < C_2(k,m) < G_H) \\ G_L & (C_2(k,m) \leq G_L) \end{cases} \tag{7B}$$

As can be understood from Equations (7A) and (7B), the process coefficient $G_{out}$(k,m) decreases as the reverberation component becomes superior to the initial sound component in the frequency component X(k,m) (the reverberation index value R(k,m) decreases), and the process coefficient $G_{out}$(k, m) (second coefficient $C_2$(k,m)) decreases as likelihood of generation of the frequency component X(k,m) from the sound source located outside the target localization range SP increases (out-of-region coefficient $L_{out}$(k,m) becomes higher than in-region coefficient $L_{in}$(km)). That is, the process coefficient $G_{out}$(k,m) (second coefficient $C_2$(k,m)) decreases as the possibility that the frequency component X(k,m) is a reverberation component generated from the sound source located outside the target localization range SP increases. Accordingly, when the frequency component X(k, m) is multiplied by the process coefficient $G_{out}$(k,m), the reverberation component of the sound signal x(t), which is generated from the sound source located outside the target localization range SP, is suppressed.

The signal processor 52 shown in FIG. 1 calculates each frequency component Y(k,m) (left-channel frequency component YL(k,m) and right-channel frequency component YR(k,m)) of the sound signal y(t) in each unit period by applying the process coefficients G ($G_g$(k,m), $G_{in}$(k,m) and $G_{out}$(k,m)) to each frequency component X(k,m) of the sound signal x(t). The waveform generator 54 generates the sound signal y(t) in the time domain (yL(t) and yR(t)) from each frequency component Y(k,m) generated by the signal processor 52. Specifically, the waveform generator 54 generates a temporal signal in each unit period by performing short-time inverse Fourier transform on series (frequency spectral) of K frequency components Y(1,m) to Y(K,m) and connecting temporal signals in consecutive unit periods so as to generate the sound signal y(t). The sound signal y(t) generated by the waveform generator 54 is reproduced as sound by the sound output unit 26.

The signal processor 52 according to the first embodiment applies one of the in-region localization information $\Gamma_{in}$(k,m) and the out-of-region localization information $\Gamma_{out}$(k,m) generated by the region determination unit 72 with the process coefficients G to the frequency component X(k,m). Processing performed by the signal processor 52 is controlled according to an instruction input to the input unit 24 by the user. Specifically, the user can arbitrarily designate the inside or outside of the target region S, the initial sound component or the reverberation component, and suppression or emphasis. A detailed process performed by the signal processor 52 according to a user instruction will now be described.

[1] Case in which Initial Sound Component and Reverberation Component Generated from Sound Source Located within the Target Region S are Suppressed When the user commands suppression of the initial sound component and reverberation component generated from the sound source within the target region S (minus power), the signal processor 52 calculates the frequency component Y(k, m) according to Equation (8).

$$Y(k,m)=\{\Gamma_{out}(k,m)G_{in}(k,m)\}X(k,m) \quad (8)$$

The out-of-region localization information $\Gamma_{out}$(k,m) of Equation (8) is used to extract each frequency component X(k,m) outside the target region from the sound signal x(t) and to suppress (remove) each frequency component X(k,m) in the target region S. When each frequency component X(k, m) is multiplied by only the out-of-region localization information $\Gamma_{out}$(k,m), a reverberation component outside the target region S, which is derived from the sound source within the target region S, remains in the sound signal y(t) in addition to a sound component (initial sound component and reverberation component) generated from a sound source located outside the target region S. The process coefficient $G_{in}$(k,m) of Equation (8) is used to suppress the reverberation component derived from the sound source within the target region S. Accordingly, according to Equation (8), it is possible to suppress both the initial sound component and reverberation component of the sound signal x(t), which are derived from the sound source located within the target region S, with high accuracy.

[2] Case in which Reverberation Component Outside Target Region S, which is Derived from the Sound Source within the Target Region S, is Suppressed When the user commands suppression of the reverberation component outside the target region S, which is derived from the sound source within the target region S, the signal processor 52 calculates the frequency component Y(k,m) according to Equation (9).

$$Y(k,m)=\{\Gamma_{in}(k,m)+\Gamma_{out}(k,m)G_{in}(k,m)\}X(k,m) \quad (9)$$

The in-region localization information $\Gamma_{in}$(k,m) of Equation (9) is used to extract each frequency component X(k,m) in the target region from the sound signal x(t) and to suppress (remove) each frequency component X(k,m) outside the target region S. According to Equation (9), it is possible to suppress the reverberation component of the sound signal x(t), which corresponds to the region outside the target region S while being derived from the sound source located within the target region S. The amplitude of the frequency component Y(k,m) calculated according to Equation (9) does not exceed the amplitude of the frequency component X(k,m) because the in-region localization information $\Gamma_{in}$(k,m) and the out-of-region localization information $\Gamma_{out}$(k,m) are complementary for the frequency fk and are not simultaneously set to 1 for one frequency fk. It is possible to replace the calculation indicated in { } of Equation (9) by operation of selecting a maximum value from the in-region localization information $\Gamma_{in}$(k,m) and a product of the out-of-region localization information $\Gamma_{out}$(k,m) and the process coefficient $G_{in}$(k,m) ($\max\{\Gamma_{in}(k,m), \Gamma_{out}(k,m)\, G_{in}(k,m)\}$).

[3] Case in which Initial Sound Component and Reverberation Component Generated from Sound Source Located within Target Region S are Extracted When the user commands extraction of the initial sound component and the reverberation component generated from the sound source within the target region S, the signal processor 52 calculates the frequency component Y(k,m) according to Equation (10).

$$Y(k,m)=\{\Gamma_{in}(k,m)+\Gamma_{out}(k,m)(1-G_{in}(k,m))\}X(k,m) \quad (10)$$

Since the process coefficient $G_{in}$(k,m) suppresses the reverberation component derived from the sound source within the target region S, coefficient $\{1-G_{in}(k,m)\}$ of Equation (10) extracts the reverberation component derived from the sound source within the target region S. Accordingly, it is possible to extract a sound component (initial sound component and reverberation component) in the target region S, which is generated from the sound source within the target region S, and a reverberation component outside the target region S, which is derived from the sound source within the target region S according to Equation (10). Similarly to Equation (9), it is possible to replace the calculation indicated in { } of Equation (10) by an operation of selecting a maximum value from the in-region localization information $\Gamma_{in}$(k, m) and a product of the out-of-region localization information $\Gamma_{out}$(k,m) and the process coefficient (1−$G_{in}$(k,m)) ($\max\{\Gamma_{in}(k,m), \Gamma_{out}(k,m)\,(1-G_{in}(k,m))\}$)

[4] Case in which Initial Sound Component in Target Region S is Extracted

When the user commands extraction of the initial sound component (initial sound component generated from the sound source within the target region S), the signal processor 52 calculates the frequency component Y(k,m) according to Equation (11).

$$Y(k,m)=\{\Gamma_{in}(k,m)G_g(k,m)G_{out}(k,m)\}X(k,m) \quad (11)$$

The process coefficient $G_g$(k,m) of Equation (11) suppresses the reverberation component of the sound signal x(t). Accordingly, when the frequency component X(k,m) is multiplied only by the in-region localization information $\Gamma_{in}$(k, m) and the process coefficient $G_g$(k,m), the frequency component X(k,m) outside the target region S can be suppressed and, simultaneously, the frequency component X(k,m) in the target region S can be suppressed (that is, the initial sound component in the target region S can be emphasized). However, the reverberation component in the target region S is not actually completely removed, and a reverberation component derived from the sound source within the target region S and a reverberation component derived from the sound source located outside the target region S remain. When the reverberation component derived from the sound source located outside the target region S is mixed with the initial sound component derived from the sound source within the target region S, unnatural sound is generated. In view of this, the reverberation component derived from the sound source located outside the target region S is suppressed using the process coefficient $G_{out}$(k,m) according to Equation (11). Accordingly, it is possible to generate the sound signal y(t) corresponding to natural sound by emphasizing the initial sound component of the sound signal X(t), which corresponds to the target region S.

[5] Case in which Reverberation Component in Target Region S, which is Derived from Sound Source within the Target Region S, is Extracted When the user commands extraction of the reverberation component derived from the sound source within the target region S, the signal processor 52 calculates the frequency component Y(k,m) according to Equation (12).

$$Y(k,m)=\{\Gamma_{in}(k,m)(1-G_g(k,m))G_{out}(k,m)\}X(k,m) \quad (12)$$

Since the process coefficient $G_g$(k,m) suppresses the reverberation component, coefficient $\{1-G_u(k,m)\}$ of Equation (12) suppresses the initial sound component of the sound signal x(t) and extracts the reverberation component. When the frequency component X(k,m) is multiplied only by the in-region localization information $\Gamma_{in}$(k,m) and the process coefficient $\{1-G_g(k,m)\}$, the frequency component X(k,m) outside the target region S can be suppressed and, simultaneously, the initial sound component from the frequency component X(k,m) in the target region S can be suppressed. A reverberation component derived from the sound source within the target region S and a reverberation component derived from the sound source located outside the target region S are present together in the frequency component X(k,m) corresponding to the target region S. In view of this, the reverberation component derived from the sound source located outside the target region S is suppressed using the process coefficient $G_{out}$(k,m) according to Equation (12). Accordingly, it is possible to extract the reverberation component corresponding to the target region S, which is derived from the sound source within the target region S, with high accuracy.

[6] Case in which Reverberation Component Corresponding to Target Region S, which is Derived from Sound Source Located Outside Target Region S, is Extracted When the user commands extraction of the reverberation component corresponding to the target region S, which is derived from the sound source located outside the target region S, the signal processor 52 calculates the frequency component Y(k,m) according to Equation (13).

$$Y(k,m)=\{\Gamma_{in}(k,m)(1-G_{out}(k,m))\}X(k,m) \quad (13)$$

Since the process coefficient $G_{out}$(k,m) suppresses the reverberation component derived from the sound source located outside the target region S, $\{1-G_{out}(k,m)\}$ of Equation (13) is used to extract the reverberation component derived from the sound source located outside the target region S. Accordingly, it is possible to extract the reverberation component corresponding to the target region S, which is derived from the sound source located outside the target region S, with high accuracy.

[7] Case in which Initial Sound Component Outside Target Region S is Extracted

When the user commands extraction of the initial sound component (initial sound component generated from the sound source located outside the target region S), the signal processor 52 calculates the frequency component Y(k,m) according to Equation (14).

$$Y(k,m)=\{\Gamma_{out}(k,m)(G_g(k,m)G_{in}(k,m)\}X(k,m) \quad (14)$$

As is understood from the above description of Equation (11), it is possible to generate the sound signal y(t) corresponding to natural sound by sufficiently suppressing the reverberation component of the frequency component X(k, m) outside the target region S, which is derived from the sound source within the target region S, and extracting the initial sound component of the sound signal x(t), which does not correspond to the target region S, according to Equation (14).

[8] Case in which Reverberation Component Outside Target Region S, which is Derived from Sound Source Located Outside Target Region S, is Extracted When the user commands extraction of the reverberation component outside the target region S, which is derived from the sound source located outside the target region S, the signal processor 52 calculates the frequency component Y(k,m) according to Equation (15).

$$Y(k,m)=\{\Gamma_{out}(k,m)(1-(G_g(k,m))G_{in}(k,m)\}X(k,m) \quad (15)$$

As is understood from the above description of Equation (12), it is possible to extract a reverberation component derived from the sound source located outside the target region S from the reverberation component of the frequency component X(k,m) outside the target region S with high accuracy according to Equation (15).

[9] Case in which Reverberation Component Outside Target Region S, which is Derived from Sound Source Located in Target Region S, is Extracted When the user commands extraction of the reverberation component outside the target region S, which is derived from the sound source within the target region S, the signal processor 52 calculates the frequency component Y(k,m) according to Equation (16).

$$Y(k,m)=\{\Gamma_{out}(k,m)(1-G_{in}(k,m)\}X(k,m) \quad (16)$$

As is understood from the above description of Equation (13), it is possible to extract the reverberation component outside the target region S, which is derived from the sound source within the target region S, with high accuracy according to Equation (16).

[10] Case in which Reverberation Component Outside Target Region S, which is Derived from Sound Source within Target Region S, is Reinforced When the user commands emphasis of the reverberation component outside the target region S, which is derived from the sound source within the target region S, the signal processor 52 calculates the frequency component Y(k,m) according to Equation (17).

$$Y(k,m)=\{1+\beta\cdot\Gamma_{out}(k,m)(1-G_{in}(k,m)\}X(k,m) \quad (17)$$

As described above with respect to Equation (16), the product of the out-of-region localization information $\Gamma_{out}$(k,m) and the coefficient {1−$G_{in}$(k,m)} is used to extract the reverberation component of the sound signal x(t), which corresponds to the outside of the target region S while being derived from the sound source within the target region S. Accordingly, it is possible to emphasize only the reverberation component of the sound signal x(t), which corresponds to the outside of the target region S while being derived from the sound source within the target region S, in response to coefficient β according to Equation (17). Coefficient β is set to a positive number, for example, according to an instruction input to the input unit 24 by the user.

According to the above-described first embodiment of the present invention, it is possible to selectively emphasize or suppress a reverberation component outside the target region S, which is derived from the sound source within the target region A, and a reverberation component corresponding to the target region S, which is derived from the sound source located outside the target region S, because the in-region coefficient $L_{in}$(k,m) and the out-of-region coefficient $L_{out}$(k,m) in addition to the reverberation index value R(k,m) are reflected in the process coefficients $G_{in}$(k,m) and $G_{out}$(k,m). That is, it is possible to emphasize or suppress a sound component (initial sound component and reverberation component) generated from a sound source located in a specific direction.

Second Embodiment

A second embodiment of the present invention will now be described. In the following embodiments, parts having the same operations and functions as those of corresponding parts in the first embodiment are denoted by the same reference numerals and detailed description thereof is omitted.

Figure 6:
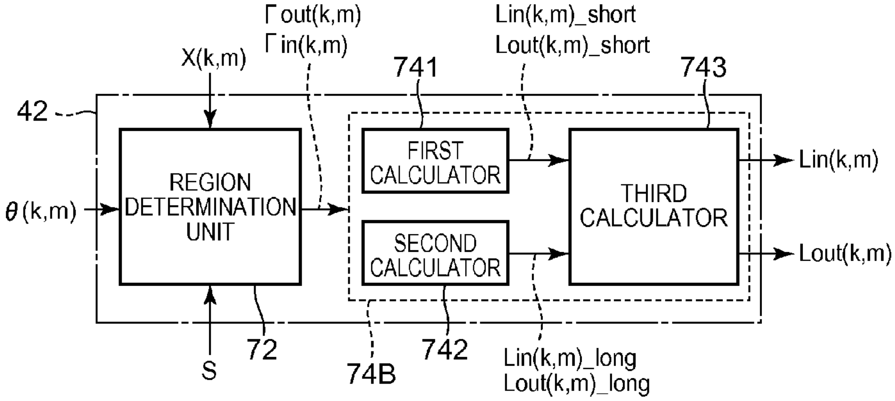
FIG. 6 is a block diagram of a likelihood calculator according to a second embodiment of the present invention.

FIG. 6 is a block diagram of the likelihood calculator 42 according to the second embodiment. The likelihood calculator 42 according to the second embodiment includes a calculation processor 74B instead of the calculation processor 74A (shown in FIG. 3) according to the first embodiment. The calculation processor 74B calculates the in-region coefficient Lm(k,m) and the out-of-region coefficient $L_{out}$(k,m) as does the calculation processor 74A according to the first embodiment and includes a first calculator 741, a second calculator 742 and a third calculator 743. The region determination unit 72 that calculates the in-region localization information $\Gamma_{in}$(k,m) and the out-of-region localization information $\Gamma_{out}$(k,m) has the same configuration and operation as those of the region determination unit 72 according to the first embodiment.

The first calculator 741 calculates a short term in-region coefficient $L_{in}$(k,m)_short by smoothing the time series of the in-region localization information $\Gamma_{in}$(k,m) and calculates a short term out-of-region coefficient $L_{out}$(k,m)_short by smoothing the time series of the out-of-region localization information $\Gamma_{out}$(k,m). A smoothing coefficient λ1 is applied to smoothing performed by the first calculator 741. Specifically, the first calculator 741 calculates an indexed moving average of the in-region localization information $\Gamma_{in}$(k,m) to which the smoothing coefficient λ1 has been applied as the short term in-region coefficient $L_{in}$(k,m)_short, as represented by Equation (18A), and calculates an indexed moving average of the out-of-region localization information $\Gamma_{out}$(k,m) to which the smoothing coefficient λ1 has been applied as the short term out-of-region coefficient $L_{out}$(k,m)_short, as represented by Equation (18B).

$$L_{in}(k,m)\_short=\lambda_1\Gamma_{in}(k,m)+(1-\lambda_1)L_{in}(k,m-1) \quad (18A)$$

$$L_{out}(k,m)\_short=\lambda_1\Gamma_{out}(k,m)+(1-\lambda_1)L_{out}(k,m-1) \quad (18B)$$

The second calculator 742 calculates a long term in-region coefficient $L_{in}$(k,m)_long by smoothing a time series of the in-region localization information $\Gamma_{in}$(k,m) and calculates a long term out-of-region coefficient $L_{out}$(k,m)_long by smoothing a time series of the out-of-region localization information $\Gamma_{out}$(k,m). A smoothing coefficient λ2, set separately from the smoothing coefficient λ1, is applied to smoothing performed by the second calculator 742. Specifically, the second calculator 742 calculates an indexed moving average of the in-region localization information $\Gamma_{in}$(k,m) to which the smoothing coefficient λ2 has been applied as the long term in-region coefficient $L_{in}$(k,m)_long, as represented by Equation (19A), and calculates an indexed moving average of the out-of-region localization information $\Gamma_{out}$(k,m) to which the smoothing coefficient λ2 has been applied as the long term out-of-region coefficient $L_{out}$(k,m)_long, as represented by Equation (19B).

$$L_{in}(k,m)\_long=\lambda_2\Gamma_{in}(k,m)+(1-\lambda_2)L_{in}(k,m-1) \quad (19A)$$

$$L_{out}(k,m)\_long=\lambda_2\Gamma_{out}(k,m)+(1-\lambda_2)L_{out}(k,m-1) \quad (19B)$$

The smoothing coefficient λ1 is set to a value greater than the smoothing coefficient λ2 (λ1>λ2). For example, the smoothing coefficient λ1 is set to the same value as the smoothing coefficient α1 of Equation (3A) and the smoothing coefficient λ2 is set to the same value as the smoothing coefficient α2 of Equation (3B). Accordingly, the time constant τ2 of smoothing performed by the second calculator 742 is greater than the time constant τ1 of smoothing performed by the first calculator 741 (τ2>τ1). That is, the long term in-region coefficient $L_{in}$(k,m)_long follows a time variation of the in-region localization information $\Gamma_{in}$(k,m) with following capability (variation) lower than that of the short term in-region coefficient $L_{in}$(k,m)_short, and the long term out-of-region coefficient $L_{out}$(k,m)_long follows a time variation of the out-of-region localization information $\Gamma_{out}$(k,m) with following capability lower than that of the short term out-of-region coefficient $L_{out}$(k,m)_short.

The third calculator 743 calculates the in-region coefficient $L_{in}$(k,m) and the out-of-region coefficient $L_{out}$(k,m) for each frequency component X(k,m) in each unit period using calculation results of the first calculator 741 and the second calculator 742. Specifically, the third calculator 743 calculates the ratio of the short term in-region coefficient $L_{in}$(k,m)_short to the long term out-of-region coefficient $L_{out}$(k,m)_long as the in-region coefficient $L_{in}$(k,m), as represented by Equation (20A), and calculates the ratio of the short term out-of-region coefficient $L_{cut}$(k,m)_short to the long term in-region coefficient $L_{in}$(k,m)_long as the out-of-region coefficient $L_{out}$(k,m) as represented by Equation (20B).

$$L_{in}(k,m)=\frac{L_{in}(k,m)\_short}{L_{out}(k,m)\_long} \quad (20A)$$

$$L_{out}(k,m)=\frac{L_{out}(k,m)\_short}{L_{in}(k,m)\_long} \quad (20B)$$

Considering the numerators of Equations (20A) and (20B), the in-region coefficient $L_{in}$(k,m) increases as likelihood of generation of the frequency component X(k,m) from the sound source within the target localization range SP increases, and the out-of-region coefficient $L_{out}$(k,m) increases as likelihood of generation of the frequency component X(k,m) from the sound source located outside the target localization range SP increases, as in the first embodiment. Accordingly, the second embodiment has the same effects as the first embodiment.

While there is a high possibility that a reverberation component derived from the sound source within the target localization range SP is present within the target localization range SP in the short term, the reverberation component may reach outside of the target localization range SP in the long term. Accordingly, when the frequency component X(k,m) corresponds to a reverberation component, the long term out-of-region coefficient $L_{out}$(k,m)_long becomes larger than the short term in-region coefficient $L_{in}$(k,m)_short, as compared to a case in which the frequency component X(k,m) corresponds to an initial sound component. That is, the in-region coefficient $L_{in}$(k,m) calculated by Equation (20A) corresponds to a value to which likelihood of the frequency component X(k,m) being a reverberation component and likelihood (equal to likelihood of the first embodiment) of generation of the frequency component X(k,m) from the sound source within the target localization range SP have been applied. Similarly, the out-of-region coefficient $L_{out}$(k, m) calculated by Equation (20B) corresponds to a value to which likelihood of generation of the frequency component X(k,m) from the sound source located outside the target localization range SP and likelihood of the frequency component X(k,m) being a reverberation component have been applied. Accordingly, the second embodiment can suppress or emphasize a reverberation component of the sound signal x(t) with high accuracy, compared to the first embodiment, by applying the process coefficients G ($G_{in}$(k,m) and $G_{out}$(k,m)) based on the in-region coefficient $L_{in}$(k,m) and the out-of-region coefficient $L_{out}$(k,m) to processing of the sound signal x(t).

Third Embodiment

Figure 7:
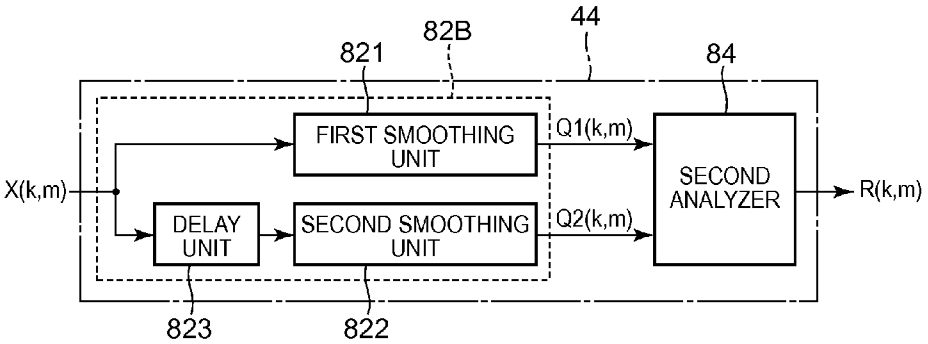
FIG. 7 is a block diagram of a reverberation analyzer according to a third embodiment of the present invention.

FIG. 7 is a block diagram of the reverberation analyzer 44 according to a third embodiment. The reverberation analyzer 44 according to the third embodiment includes a first analyzer 82B instead of the first analyzer 82A (FIG. 4) according to the first embodiment. The first analyzer 82B calculates the first index value $Q_1$(k,m) and the second index value $Q_2$(k,m) in each unit period and includes a first smoothing unit 821 and a second smoothing unit 822 as in the first analyzer 82A according to the first embodiment. The second analyzer 84 has the same configuration and operation as those of the second analyzer 84 according to the first embodiment.

The first smoothing unit 821 calculates the first index value $Q_1$(k,m) in each unit period by smoothing power $|X(k,m)|^2$ of each frequency component X(k,m), as in the first embodiment. A delay unit 823 is a memory circuit that delays each frequency component X(k,m) by a time corresponding to d unit periods (d being a natural number). The second smoothing unit 822 calculates the second index value $Q_2$(k,m) in each unit period by smoothing power $|X(k,m)|^2$ of each frequency component X(k,m) which has been delayed by the delay unit 823. In the third embodiment, the time constant τ1 of smoothing performed by the first smoothing unit 821 is equal to the time constant τ2 of smoothing performed by the second smoothing unit 822 (τ1=τ2). However, it may be possible to set the time constants τ1 and τ2 to different vales. In addition, it may be possible to employ a configuration (configuration in which the second soothing unit 822 is omitted) in which the second index value $Q_2$(k,m) is calculated by delaying the first index value $Q_1$(k,m) calculated by the first smoothing unit 821.

Figure 8A:
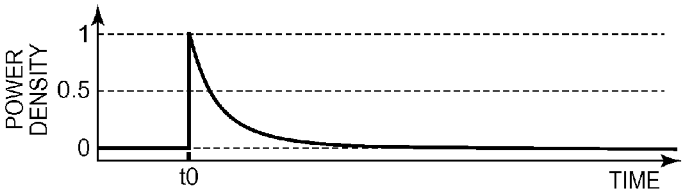
FIGS. 8A-8C illustrate the relationship between the first index value and the second index value according to the third embodiment of the present invention.
Figure 8B:
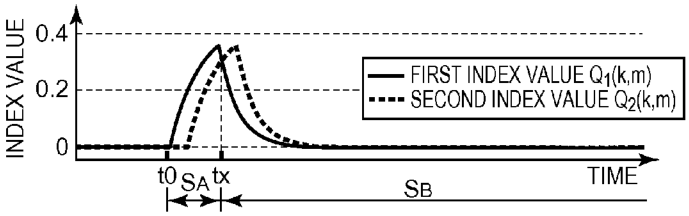

FIG. 8B is a graph showing time variations of the first index value $Q_1$(k,m) and the second index value $Q_2$(k,m) when the same room impulse response (RIR) (FIG. 8A) as that shown in FIG. 5A is supplied as the sound signal x(t) to the sound processing apparatus 100 according to the third embodiment.

As will be understood from FIG. 8B, while time variation forms (waveforms) in the first index value $Q_1$(k,m) and the second index value $Q_2$(k,m) are identical to each other, the time variation of the second index value $Q_2$(k,m) is delayed from the time variation of the first index value $Q_1$(k,m) by the time corresponding to d unit periods. That is, the second index value $Q_2$(k,m) follows power $|X(k,m)|^2$ of each frequency component X(k,m) with following capability lower than that of the first index value $Q_1$(k,m). Accordingly, the levels of the first index value $Q_1$(k,m) and the second index value $Q_2$(k,m) are reversed at a specific time tx on the time domain, as in the first embodiment. That is, the first index value $Q_1$(k,m) is greater than the second index value $Q_2$(k,m) in the period SA before time tx and the second index value $Q_2$(k,m) is greater than the first index value $Q_1$(k,m) in the period SB after time tx.

Figure 8C:
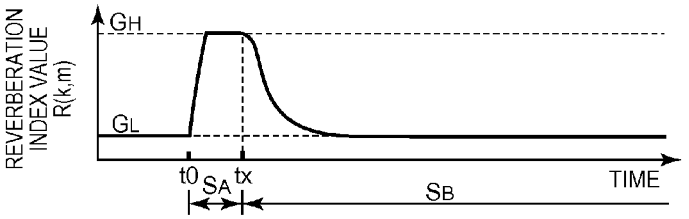

Since calculation (Equation (4)) of the reverberation index value R(k,m), performed by the second analyzer 84, corresponds to that of the first embodiment, the reverberation index value R(k,m) is set to 1 in the period SA in which an initial sound component is present and temporally decreases to the lower limit $G_L$ in the period SB in which a reverberation component is present, as shown in FIG. 8C. Accordingly, the third embodiment can obtain the same effects as the first embodiment. It is possible to apply the third embodiment to the second embodiment.

<Modifications>

The above-described embodiments can be modified in various manners. Detailed modifications will be described below. Two or more embodiments arbitrarily selected from the following embodiments can be appropriately combined.

(1) While the indexed moving average of power $|X(k,m)|^2$ of each frequency component X(k,m) is calculated as the first index value $Q_1$(k,m) and the second index value $Q_2$(k,m) in the above-described embodiments, the method of calculating the first index value $Q_1$(k,m) and the second index value $Q_2$(k,m) is not limited to the above-mentioned embodiments. For example, it is possible to calculate a simple moving average of power $|X(k,m)|^2$ of each frequency component X(k,m) as the first index value $Q_1$(k,m) and the second index value $Q_2$(k,m), as represented by Equations (21A) and (21B).

$$Q_1(k,m) = \frac{1}{M_1}\sum_{i=0}^{M_1-1}|X(k,m-i)|^2 \tag{21A}$$

$$Q_2(k,m) = \frac{1}{M_2}\sum_{i=0}^{M_2-1}|X(k,m-i)|^2 \tag{21B}$$

The first index value $Q_1$(k,m) of Equation (21A) corresponds to a moving average of power $|X(k,m)|^2$ of in a first period corresponding to $M_1$ phase-continuous unit periods ($M_1$ being a natural number greater than 2). For example, the first period corresponds to a set of the $M_1$ unit periods having an m-th unit period as the last unit period. The second index value $Q_2(k,m)$ of Equation (21B) corresponds to a moving average of power $|X(k,m)|^2$ of in a second period corresponding to $M_2$ phase-continuous unit periods ($M_2$ being a natural number greater than 2). For example, the second period corresponds to a set of the $M_2$ unit periods having an m-th unit period as the last unit period. The number $M_2$ of unit periods, which is used to calculate the second index value $Q_2(k,m)$, is greater than the number $M_1$ of unit periods, which is used to calculate the first index value $Q_1(k,m)$ ($M_2>M_1$). That is, the second period is longer than the first period. For example, the first period is set to a time of about 100 msec to 300 msec and the second period is set to a time of about 300 msec to 600 msec. Accordingly, the time constant τ2 of smoothing performed by the second smoothing unit 822 is greater than the time constant τ1 of smoothing performed by the first smoothing unit 821 (τ2>τ1) as in the above-described embodiments. That is, the second index value $Q_2(k,m)$ follows power $|X(k,m)|^2$ of each frequency component X(k,m) with following capability lower than that of the first index value $Q_1(k,m)$. It is possible to calculate a weighted moving average of power $|X(k,m)|^2$ of as the first index value $Q_1(k,m)$ and the second index value $Q_2(k,m)$.

In addition, it is possible to calculate the short term in-region coefficient $L_{in}(k,m)$_short and short term out-of-region coefficient $L_{out}(k,m)$_short or the long term in-region coefficient $L_{in}(k,m)$_long and long term out-of-region coefficient $L_{out}(k,m)$_long of the second embodiment using a simple moving average or a weighted moving average. The duration (the number of unit periods) used to calculate the long term in-region coefficient $L_{in}(k,m)$_long and long term out-of-region coefficient $L_{out}(k,m)$_long is longer than the duration of a time used to calculate the short term in-region coefficient $L_{in}(k,m)$_short and short term out-of-region coefficient $L_{out}(k,m)$_short.

(2) While the process coefficients G ($G_g(k,m)$, $G_{in}(k,m)$ and $G_{out}(k,m)$) for suppressing the reverberation component of the sound signal x(t) are calculated in the above-described embodiments, it is also possible to calculate process coefficients G ($G_g(k,m)$, $G_{in}(k,m)$ and $G_{out}(k,m)$) for emphasizing the reverberation component of the sound signal x(t). For example, when the reverberation index value R(k,m) is within the range from the upper limit $G_H$ to the lower limit $G_L$ in processing according to Equation (5), the process coefficient $G_g(k,m)$ for emphasizing the reverberation component is calculated by setting the process coefficient $G_g(k,m)$ to $\{1-R(k,m)\}$. Similarly, if the process coefficient $G_{in}(k,m)$ is set to $\{1-C_1(k,m)\}$ in processing according to Equation (6B), the process coefficient $G_{in}(k,m)$ for emphasizing a reverberation component of the sound signal x(t), which is generated from a sound source within the target localization range SP, is calculated. If the process coefficient $G_{out}(k,m)$ is set to $\{1-C_2(k,m)\}$ in processing according to Equation (7B), the process coefficient $G_{out}(k,m)$ for emphasizing a reverberation component of the sound signal x(t), which is generated from a sound source located outside the target localization range SP, is calculated.

Since $\{1-R(k,m)\}$ is a value less than 1, a reverberation component cannot be emphasized compared to a reverberation component included in the sound signal x(t) in a configuration in which the process coefficient $G_g(k,m)$ is set to $\{1-R(k,m)\}$ as described above. To emphasize the reverberation component, a configuration in which a value $\{\sigma-R(k,m)\}$ to which a coefficient σ larger than 1 is applied is used as the process coefficient $G_g(k,m)$ is employed. However, because the reverberation index value R(k,m) is slightly delayed from a sound generation point (time t0) and varied, as shown in FIG. 5C, the reverberation index value R(k,m) is smaller than 1 immediately after the sound generation point, and thus initial part of sound (initial sound component) may be emphasized. Accordingly, it is preferable to set the process coefficient $G_g(k,m)$ to $\{\{\sigma-R(k,m)\}$ only in a damping period (that is, a period other than the initiation period) of the reverberation index value R(k,m). For example, it is possible to set the process coefficient $G_g(k,m)$ to $\{\sigma-R(k,m)\}$ after a predetermined time from the sound generation point detected from the sound signal x(t). A known technique can be used to detect the sound generation point.

(3) The methods of calculating the in-region coefficient $L_{in}(k,m)$ and the out-of-region coefficient $L_{out}(k,m)$ are not limited to the above-described embodiments. For example, the calculation processor 74A according to the first embodiment can calculate the in-region coefficient $L_{in}(k,m)$ and the out-of-region coefficient $L_{out}(k,m)$ according to the following equation (22A) and (22B). A smoothing coefficient λ1 of Equation (22B) is set to a value greater than a smoothing coefficient λ2 of Equation (22A). That is, the time constant τ2 of smoothing of the in-region localization information $\Gamma_{in}(k,m)$ is greater than the time constant τ1 of smoothing of the out-of-region localization information $\Gamma_{out}(k,m)$.

$$L_{in}(k,m)=\lambda_2\Gamma_{in}(k,m)+(1-\lambda_2)L_{in}(k,m-1) \tag{22A}$$

$$L_{out}(k,m)=\lambda_2\Gamma_{out}(k,m)+(1-\lambda_2)L_{out}(k,m-1) \tag{22B}$$

(4) The method of calculating the reverberation index value R(k,m) is not limited to the above-described embodiments. For example, it is possible to calculate the ratio of the second index value $Q_2(k,m)$ to the first index value $Q_1(k,m)$ as the reverberation index value R(k,m) indicating the ratio of the initial sound component (ratio of the reverberation component). In addition, it is also possible to compare a sound model, which is obtained by modeling a feature amount distribution of the reverberation component or the initial sound component as a normal mixture, with the feature amount of each frequency component X(k,m) and to calculate likelihood (likelihood of the frequency component X(k,m) being a reverberation component or an initial sound component) of generation of the frequency component X(k,m) from the sound model as the reverberation index value R(k,m).

(5) While both the process coefficient $G_{in}(k,m)$ and the process coefficient $G_{out}(k,m)$ are calculated in the above-described embodiments, only one of the process coefficient $G_{in}(k,m)$ and the process coefficient $G_{out}(k,m)$ may be calculated. Furthermore, while the in-region localization information $\Gamma_{in}(k,m)$ or the out-of-region localization information $\Gamma_{out}(k,m)$ in addition to the process coefficient G ($G_g(k,m)$, $G_{in}(k,m)$ and $G_{out}(k,m)$) are applied to the sound signal x(t) in the above-described embodiments, it is possible to employ a configuration in which only the process coefficient G is applied to processing of the sound signal x(t) (configuration in which the in-region localization information $\Gamma_{in}(k,m)$ or the out-of-region localization information $\Gamma_{out}(k,m)$ are not applied to processing of the sound signal x(t)). For example, it is possible to suppress or emphasize a reverberation component generated from a sound source within the target localization range SP by applying the process coefficient $G_{in}(k,m)$ to processing of the sound signal x(t) and to suppress or emphasize a reverberation component generated from a sound source located outside the target localization range SP by applying the process coefficient $G_{out}(k,m)$ to processing of the sound signal x(t).

(6) While the first coefficient $C_1(k,m)$ and the second coefficient $C_2(k,m)$ are calculated by multiplying the reverberation index value R(k,m) by the ratio of the in-region coefficient $L_{in}(k,m)$ to the out-of-region coefficient $L_{out}(k,m)$ ($L_{out}$ $(k,m)/L_{in}(k,m)$, $L_{in}(k,m)/L_{out}(k,m)$) in the above-described embodiments, the method of calculating the first coefficient $C_1(k,m)$ and the second coefficient $C_2(k,m)$ on the basis of the in-region coefficient $L_{in}(k,m)$ and the out-of-region coefficient $L_{out}(k,m)$ is not limited to the above-described embodiments. For example, it is possible to employ a configuration in which the first coefficient $C_1(k,m)$ ($C_1(k,m)=\{Ax\cdot L_{out}(k,m)/L_{in}(k,)\}\cdot R(k,m)$) is calculated by multiplying the ratio of the out-of-region coefficient $L_{out}$ (k,m) to the in-region coefficient $L_{in}(k,m)$ ($L_{out}(k,m)/L_{in}(k,m)$) by a predetermined coefficient Ax and multiplying the multiplication result by the reverberation index value R(k,m) and a configuration in which the first coefficient $C_1(k,m)$ is calculated by multiplying the reverberation index value R(k,m) by the ratio of $(L_{out}(k,m))^{n2}$ to $(L_{in}(k,m))^{n1}$ (regardless of whether the exponents n1 and n2 are different from or equal to each other). Furthermore, the first coefficient $C_1(k,m)$ may be calculated by multiplying the reverberation index value R(k,m) by a difference ($L_{out}(k,m)-L_{in}(k,m)$) between the out-of-region coefficient $L_{out}(k,m)$ and the in-region coefficient $L_{in}(k,m)$. The second coefficient $C_2(k,m)$ may be modified in the same manner.

As can be seen from the above description, it is desirable that the first coefficient $C_1(k,m)$ (process coefficient $G_{in}(k,m)$) decreases as the in-region coefficient Lm(k,m) increases compared to the out-of-region coefficient $L_{out}(k,m)$ (that is, likelihood that the frequency component X(k,m) is generated from a sound source within the target located range SP increases), and the first coefficient $C_1(k,m)$ (process coefficient $G_{in}(k,m)$) decreases as the reverberation index value R(k,m) decreases (that is, a reverberation component in the frequency component X(k,m) becomes superior to an initial sound component). While the first coefficient $C_1(k,m)$ (process coefficient $G_{in}(k,m)$) has been exemplified in the above description, calculation of the second coefficient $C_2(k,m)$ (process coefficient $G_{out}(k,m)$) may be modified in the same manner. That is, it is desirable that the second coefficient $C_2(k,m)$ (process coefficient $G_{out}(k,m)$) decreases as the out-of-region coefficient $L_{out}(k,m)$ increases compared to the in-region coefficient $L_{in}(k,m)$ (that is, likelihood that the frequency component X(k,m) is generated from a sound source located outside the target localization range SP increases), and the second coefficient $C_2(k,m)$ (process coefficient $G_{out}(k,m)$) decreases as the reverberation index value R(k,m) decreases.

The method of calculating the in-region coefficient $L_{in}(k,m)$ and the out-of-region coefficient $L_{out}(k,m)$ according to the second embodiment is not limited to Equations (20A) and (20B). For example, it is possible to employ a configuration in which a difference $\{L_{in}(k,m)\_short-L_{out}(k,m)\_long\}$ between the short term in-region coefficient $L_{in}(k,m)\_short$ and the long term out-of-region coefficient $L_{out}(k,m)\_long$ is calculated as the in-region coefficient $L_{in}(k,m)$ and a configuration in which the in-region coefficient $L_{in}(k,m)$ is calculated through a predetermined calculation to which the short term in-region coefficient $L_{in}(k,m)\_short$ and the long term out-of-region coefficient $L_{out}(k,m)\_long$ are applied. Calculation of the out-of-region coefficient $L_{out}(k,m)$ can be modified in the same manner.

(7) Various sound effects (e.g. compression, equalization, reverberation, etc.) can be applied to the sound signal y(t) generated in the above-described embodiments. For example, it is possible to generate a new characteristic sound by respectively applying sound effects to the sound signal y(t) from which one of the reverberation component and the initial sound component has been extracted and the sound signal y(t) from which both the reverberation component and the initial sound component have been extracted. Furthermore, it is possible to apply various sound effects (e.g. suppression or emphasis, compression, equalization, reverberation, etc.) to the sound signal y(t) from which a reverberation component derived from a sound source within the target localization range SP (e.g. a sound source located in front of the left or right of a point at which sound is heard) has been extracted.

(8) While the first index value $Q_1(k,m)$ and the second index value $Q_2(k,m)$ are calculated by smoothing the time series of power $|X(k,m)|^2$ of each frequency component X(k,m) in the above-described embodiments, the target of smoothing according to the first smoothing unit 821 and the second smoothing unit 822 is not limited to $|X(k,m)|^2$. For example, it is possible to calculate the first index value $Q_1(k,m)$ and the second index value $Q_2(k,m)$ by smoothing the amplitude $|X(k,m)|$ of each frequency component X(k,m) and $|X(k,m)|^4$. That is, the first smoothing unit 821 and the second smoothing unit 822 in the above-described embodiments are included as elements for smoothing a time series of the intensity of the sound signal x(t), and the intensity of the sound signal x(t) includes $|X(k,m)|$ and $|X(k,m)|^4$ in addition to $|X(k,m)|^2$.

What is claimed is:

1. A sound processing apparatus, comprising:

a localization analysis unit configured to calculate a localization of each frequency component of a sound signal;

a likelihood calculation unit configured to calculate an in-region coefficient and an out-of-region coefficient on the basis of the localization of each frequency component of the sound signal, the in-region coefficient indicating likelihood of generation of each frequency component from a sound source within a given target localization range, the out-of-region coefficient indicating likelihood of generation of each frequency component from a sound source located outside the target localization range;

a reverberation analysis unit configured to calculate a reverberation index value on the basis of the ratio of a reverberation component for each frequency component of the sound signal;

a coefficient setting unit configured to generate a process coefficient for suppressing or emphasizing a reverberation component generated from a sound source within the target localization range or a reverberation component generated from a sound source located outside the target localization range, for each frequency component of the sound signal, on the basis of the in-region coefficient, the out-of-region coefficient and the reverberation index value; and a signal processing unit configured to apply the process coefficient of each frequency component to each frequency component of the sound signal.

2. The sound processing apparatus of claim 1, further comprising a range setting unit configured to set the target localization range on a localization domain.

3. The sound processing apparatus of claim 2, wherein the range setting unit is configured to set a target region that is defined on a frequency-localization plane and that has a target frequency range on a frequency domain of the frequency-localization plane and the target localization range on the localization domain of the frequency-localization plane, and wherein the likelihood calculation unit includes a region determination unit configured to calculate in-region localization information indicating whether each frequency component of the sound signal is located in the target region and out-of-region localization information indicating whether each frequency component is located outside the target region on the basis of the localization of each frequency component in each unit period, and a calculation processing unit configured to calculate the in-region coefficient based on a moving average of the in-region localization information over unit periods and to calculate the out-of-region coefficient based on a moving average of the out-of-region localization information over unit periods.

4. The sound processing apparatus of claim 3, wherein the signal processing unit applies the process coefficient of each frequency component and one of the in-region localization information and the out-of-region localization information of each frequency component to each frequency component of the sound signal.

5. The sound processing apparatus of claim 3, wherein the calculation processing unit comprises:

a first calculation unit configured to calculate a short term in-region coefficient by smoothing a time series of the in-region localization information and to calculate a short term out-of-region coefficient by smoothing a time series of the out-of-region localization information;

a second calculation unit configured to calculate a long term in-region coefficient by smoothing a time series of the in-region localization information and to calculate a long term out-of-region coefficient by smoothing a time series of the out-of-region localization information, the second calculation unit performing the smoothing using a time constant greater than a time constant of the smoothing according to the first calculation unit; and a third calculation unit configured to calculate the in-region coefficient according to the short term in-region coefficient relative to the long term out-of-region coefficient and to calculate the out-of-region coefficient according to the short term out-of-region coefficient relative to the long term in-region coefficient.

6. The sound processing apparatus of claim 1, wherein the reverberation analysis unit comprises:

a first analysis unit configured to calculate a first index value following a time variation of the sound signal and a second index value following the time variation of the sound signal with following capability lower than that of the first index value; and a second analysis unit configured to calculate the reverberation index value on the basis of a difference between the first index value and the second index value.

7. The sound processing apparatus of claim 6, wherein the first analysis unit comprises a first smoothing unit configured to calculate the first index value by smoothing time series of intensity of the sound signal and a second smoothing unit configured to calculate the second index value by smoothing the time series of the intensity of the sound signal using a time constant greater than a time constant of the smoothing according to the first smoothing unit.

8. The sound processing apparatus of claim 6, wherein the first analysis unit is configured to generate the first index value and the second index value by smoothing the time series of the intensity of the sound signal such that a time variation of the second index value delays a time variation of the first index value.

9. A sound processing method comprising:

calculating a localization of each frequency component of a sound signal;

calculating an in-region coefficient and an out-of-region coefficient on the basis of the localization of each frequency component of the sound signal, the in-region coefficient indicating likelihood of generation of each frequency component from a sound source within a given target localization range, the out-of-region coefficient indicating likelihood of generation of each frequency component from a sound source located outside the target localization range;

calculating a reverberation index value on the basis of the ratio of a reverberation component for each frequency component of the sound signal;

generating a process coefficient for suppressing or emphasizing a reverberation component generated from a sound source within the target localization range or a reverberation component generated from a sound source located outside the target localization range, for each frequency component of the sound signal, on the basis of the in-region coefficient, the out-of-region coefficient and the reverberation index value; and applying the process coefficient of each frequency component to each frequency component of the sound signal.

10. A machine readable non-transitory medium containing program instructions executable by a computer to perform processing of a sound signal, comprising:

calculating a localization of each frequency component of a sound signal;

calculating an in-region coefficient and an out-of-region coefficient on the basis of the localization of each frequency component of the sound signal, the in-region coefficient indicating likelihood of generation of each frequency component from a sound source within a given target localization range, the out-of-region coefficient indicating likelihood of generation of each frequency component from a sound source located outside the target localization range;

calculating a reverberation index value on the basis of the ratio of a reverberation component for each frequency component of the sound signal;

generating a process coefficient for suppressing or emphasizing a reverberation component generated from a sound source within the target localization range or a reverberation component generated from a sound source located outside the target localization range, for each frequency component of the sound signal, on the basis of the in-region coefficient, the out-of-region coefficient and the reverberation index value; and applying the process coefficient of each frequency component to each frequency component of the sound signal.

* * * * *